United States Patent
Graf et al.

(10) Patent No.: US 9,299,590 B1
(45) Date of Patent: Mar. 29, 2016

(54) INTEGRATED MICRO-PELTIER COOLING COMPONENTS IN SILICON-ON-INSULATOR (SOI) LAYERS

(71) Applicant: GLOBALFOUNDRIES INC., Grand Cayman (KY)

(72) Inventors: Richard S. Graf, Gray, ME (US); Ezra D. B. Hall, Richmond, VT (US); Vibhor Jain, Essex Junction, VT (US); Jack R. Smith, South Burlington, VT (US); Sebastian T. Ventrone, South Burlington, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/743,030

(22) Filed: Jun. 18, 2015

(51) Int. Cl.
| | |
|---|---|
| H01L 21/66 | (2006.01) |
| H01L 21/48 | (2006.01) |
| H01L 21/78 | (2006.01) |
| H01L 21/768 | (2006.01) |
| H01L 21/56 | (2006.01) |
| H01L 23/38 | (2006.01) |
| H01L 23/367 | (2006.01) |

(52) U.S. Cl.
CPC ............ *H01L 21/4871* (2013.01); *H01L 21/56* (2013.01); *H01L 21/76802* (2013.01); *H01L 21/76877* (2013.01); *H01L 21/76898* (2013.01); *H01L 21/78* (2013.01); *H01L 23/3675* (2013.01); *H01L 23/38* (2013.01)

(58) Field of Classification Search
CPC ................ H01L 21/76877; H01L 21/4871; H01L 21/76802
See application file for complete search history.

(56) References Cited

U.S. PATENT DOCUMENTS

| | | | |
|---|---|---|---|
| 6,476,483 B1 | 11/2002 | Adler et al. | |
| 7,893,529 B2 * | 2/2011 | Hsu | H01L 23/481 |
| | | | 136/203 |
| 8,274,101 B2 | 9/2012 | Venezia et al. | |
| 8,461,035 B1 * | 6/2013 | Cronquist | H01L 23/481 |
| | | | 257/E21.614 |
| 8,756,549 B2 | 6/2014 | Graf et al. | |
| 2012/0261799 A1 | 10/2012 | Sasaki et al. | |
| 2014/0203433 A1 * | 7/2014 | Kinser | H01L 23/38 |
| | | | 257/738 |

FOREIGN PATENT DOCUMENTS

EP 1148558 A2 10/2001

OTHER PUBLICATIONS

U.S. Appl. No. 14/296,812, filed Jun. 5, 2014.

* cited by examiner

*Primary Examiner* — Bradley K Smith
(74) *Attorney, Agent, or Firm* — Anthony Canale; Hoffman Warnick LLC (57) ABSTRACT

Various particular embodiments include a method of forming an integrated circuit (IC) device including: forming at least one thermoelectric cooling device over an upper surface of a handle wafer based upon a known location of an elevated temperature region in the IC device; forming a first oxide layer over the handle wafer covering the thermoelectric cooling device; forming a second oxide layer over a donor silicon wafer to form a donor wafer; bonding the donor wafer to the handle wafer at the first oxide layer and the second oxide layer, such that the second oxide layer contacts the first oxide layer on the handle wafer; and forming at least one semiconductor device over the donor silicon wafer side of the donor wafer, wherein the at least one thermoelectric cooling device is located proximate the at least one semiconductor device.

20 Claims, 13 Drawing Sheets

INTEGRATED MICRO-PELTIER COOLING COMPONENTS IN SILICON-ON-INSULATOR (SOI) LAYERS

BACKGROUND

The subject matter disclosed herein relates to integrated circuits. More particularly, the subject matter relates to methods of cooling layers within integrated circuits.

As devices relying upon integrated circuits (ICs) have increased in complexity and functionality, those devices have required ever more dynamic ICs to meet the demands of those device users. Additionally, as the amount of circuitry per unit of area (and volume) increases, cooling demands also increase. Some conventional approaches for cooling ICs utilize Peltier coolers to control the temperature of an entire chip. However, these approaches fail to address the localized over-heating issues that occur within particular layers and/or regions of the chip.

SUMMARY

Various embodiments include methods of forming an integrated circuit (IC) device including: forming at least one thermoelectric cooling device over an upper surface of a handle wafer based upon a known location of an elevated temperature region in the IC device; forming a first oxide layer over the handle wafer covering the thermoelectric cooling device; forming a second oxide layer over a donor silicon wafer to form a donor wafer; bonding the donor wafer to the handle wafer at the first oxide layer and the second oxide layer, such that the second oxide layer contacts the first oxide layer on the handle wafer; and forming at least one semiconductor device over the donor silicon wafer side of the donor wafer, wherein the at least one thermoelectric cooling device is located proximate the at least one semiconductor device.

A first aspect includes a method of forming an integrated circuit (IC) device including: forming at least one thermoelectric cooling device over an upper surface of a handle wafer based upon a known location of an elevated temperature region in the IC device; forming a first oxide layer over the handle wafer covering the thermoelectric cooling device; forming a second oxide layer over a donor silicon wafer to form a donor wafer; bonding the donor wafer to the handle wafer at the first oxide layer and the second oxide layer, such that the second oxide layer contacts the first oxide layer on the handle wafer; and forming at least one semiconductor device over the donor silicon wafer side of the donor wafer, wherein the at least one thermoelectric cooling device is located proximate the at least one semiconductor device.

A second aspect includes a method of forming an integrated circuit (IC) device, the method including: forming at least one semiconductor device over a silicon-on-insulator (SOI) substrate, the SOI substrate having: a first silicon layer; at least one thermoelectric cooling device over an upper surface of the first silicon layer; an oxide layer over the first silicon layer and the at least one thermoelectric cooling device; and a second silicon layer over the oxide layer; and forming at least one through silicon via (TSV) from a region proximate the at least one semiconductor device in the second silicon layer, through the oxide layer, to contact the at least one thermoelectric cooling device, wherein the at least one semiconductor device is located in an elevated temperature region of the IC device, and wherein a location of the at least one thermoelectric cooling device is determined to vertically correspond with the elevated temperature region.

A third aspect includes a method of forming an integrated circuit (IC) device, the method including: running a functional simulation on a data file used to form the IC device, the functional simulation indicating a temperature of each of a plurality of regions in the IC device; identifying at least one elevated temperature region in the plurality of regions as having a simulated temperature greater than a temperature design condition; forming at least one thermoelectric cooling device over an upper surface of a handle wafer based upon the location of the elevated temperature region in the IC device; forming a first oxide layer over the handle wafer covering the thermoelectric cooling device; forming a second oxide layer over a donor silicon wafer to form a donor wafer; bonding the donor wafer to the handle wafer at the first oxide layer and the second oxide layer, such that the second oxide layer contacts the first oxide layer on the handle wafer; and forming at least one semiconductor device over the donor silicon wafer side of the donor wafer, wherein the at least one thermoelectric cooling device is located proximate the at least one semiconductor device.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not necessarily to scale. The drawings are intended to depict only typical aspects of the invention, and therefore should not be considered as limiting the scope of the invention. In the drawings, like numbering represents like elements between the drawings.

DETAILED DESCRIPTION

As noted, the subject matter disclosed herein relates to integrated circuits (ICs). More particularly, in some cases, the subject matter relates to methods of forming Peltier cooling components in silicon-on-insulator (SOI) layers of ICs. Particular embodiments may be especially useful in SOI-based devices due to the amount of free space (space free of circuitry) below the active SOI devices (e.g., semiconductor devices).

In contrast to conventional approaches, various embodiments include methods of forming an IC structure, in particular, one or more SOI layers within an IC, having localized Peltier cooling components (also referred to as thermoelectric coolers, or TECs) for controlling temperatures of one or more "hot spots" (temperature concern regions) in the IC. Various additional embodiments include approaches for actively controlling the temperature proximate these hot spots using the Peltier cooling (TEC) components. As is known in the art, a Peltier cooler, or TEC, is a thermoelectric heat transfer device that transfers heat (conventionally for cooling purposes) using the Peltier effect. The Peltier cooling component has two sides, and when direct current (DC) flows through the component, it carries heat from one side of the component to the other. This increases the temperature of one side when compared with the other. The destination (hotter) side is coupled with a heat sink so that it remains at a substantially stable temperature, while the origin (cooler) side is cooled by the flow of the DC current.

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings and it is to be understood that other embodiments may be utilized and that changes may be made without departing from the scope of the present teachings. The following description is, therefore, merely illustrative.

Figure 1:
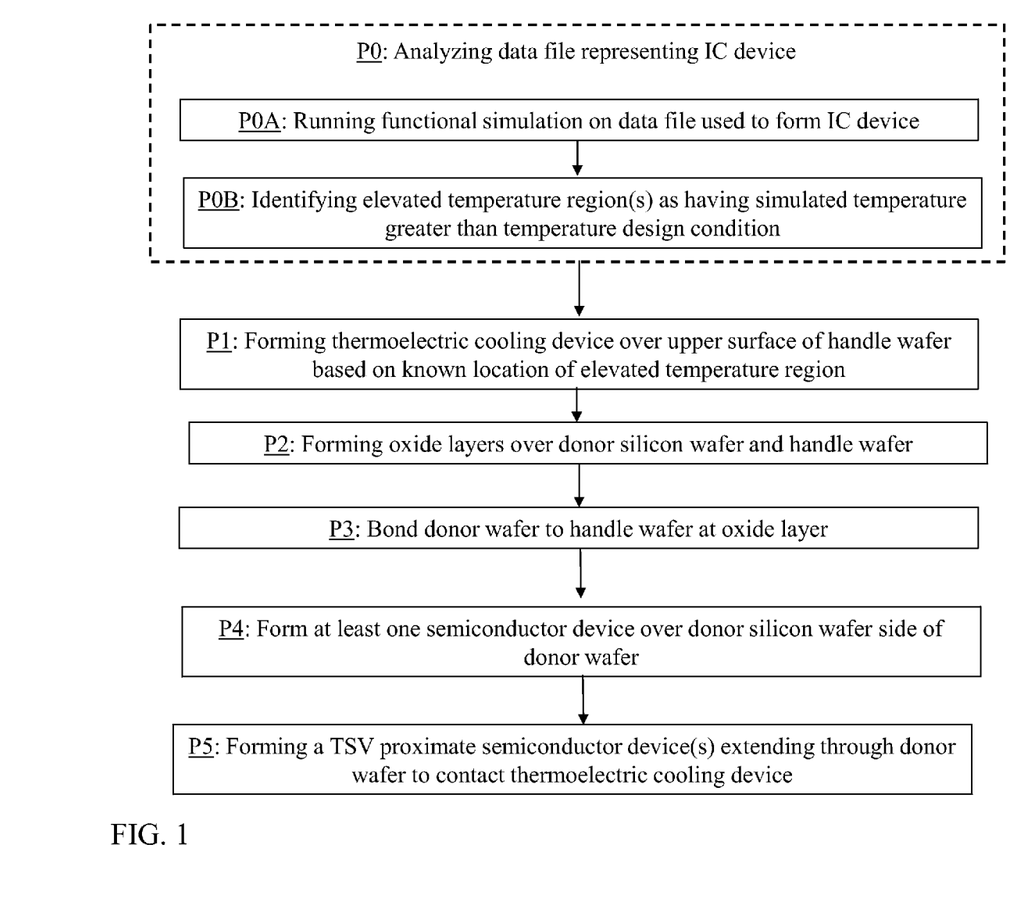
FIG. 1 shows a flow diagram illustrating processes in methods according to various embodiments of the disclosure.
Figure 2:
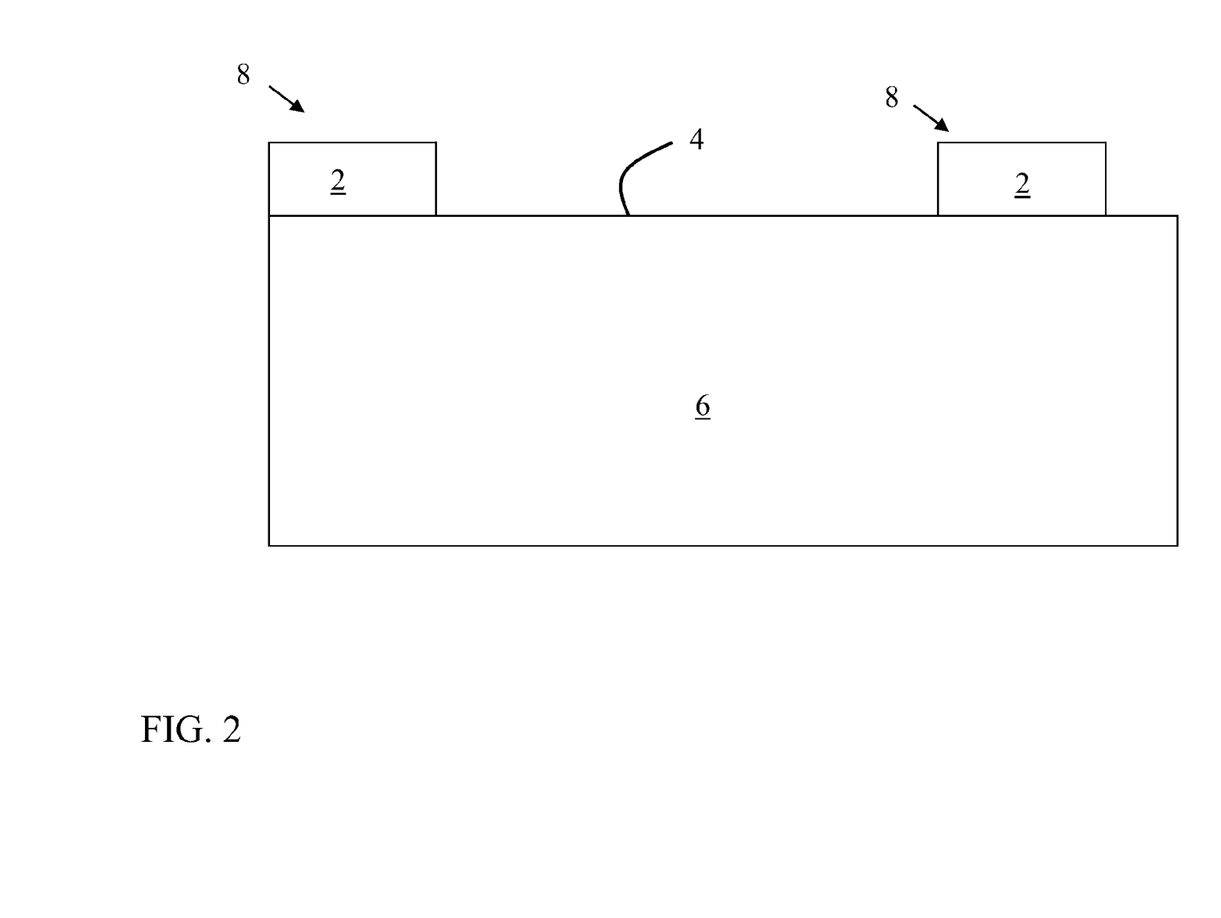
FIG. 2 shows a cross-sectional depiction of an integrated circuit device undergoing a process according to the flow diagram of FIG. 1.

FIG. 1 is a flow diagram illustrating processes in a method of forming an integrated circuit (IC) structure according to various embodiments of the disclosure. It is understood that the processes can be performed in the order show and described, or in some cases, in another order. FIGS. 2-8 show schematic depictions of processes in forming an IC structure which coincide with the flow diagram of FIG. 1. As such, reference is made simultaneously to FIGS. 1-8.

Figure 3:
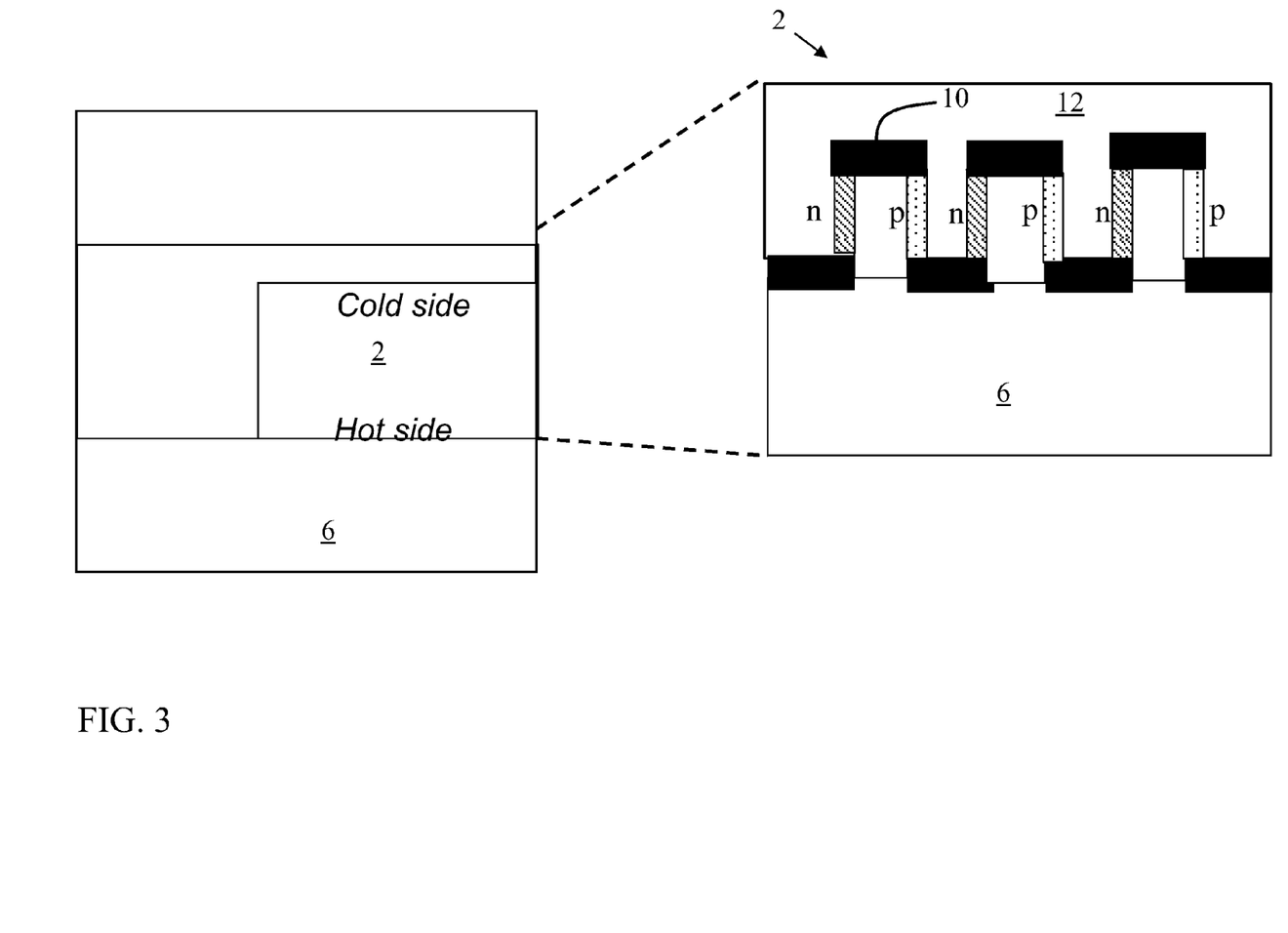
FIG. 3 shows a cross-sectional depiction of an integrated circuit device undergoing a process according to the flow diagram of FIG. 1.
Figure 6:
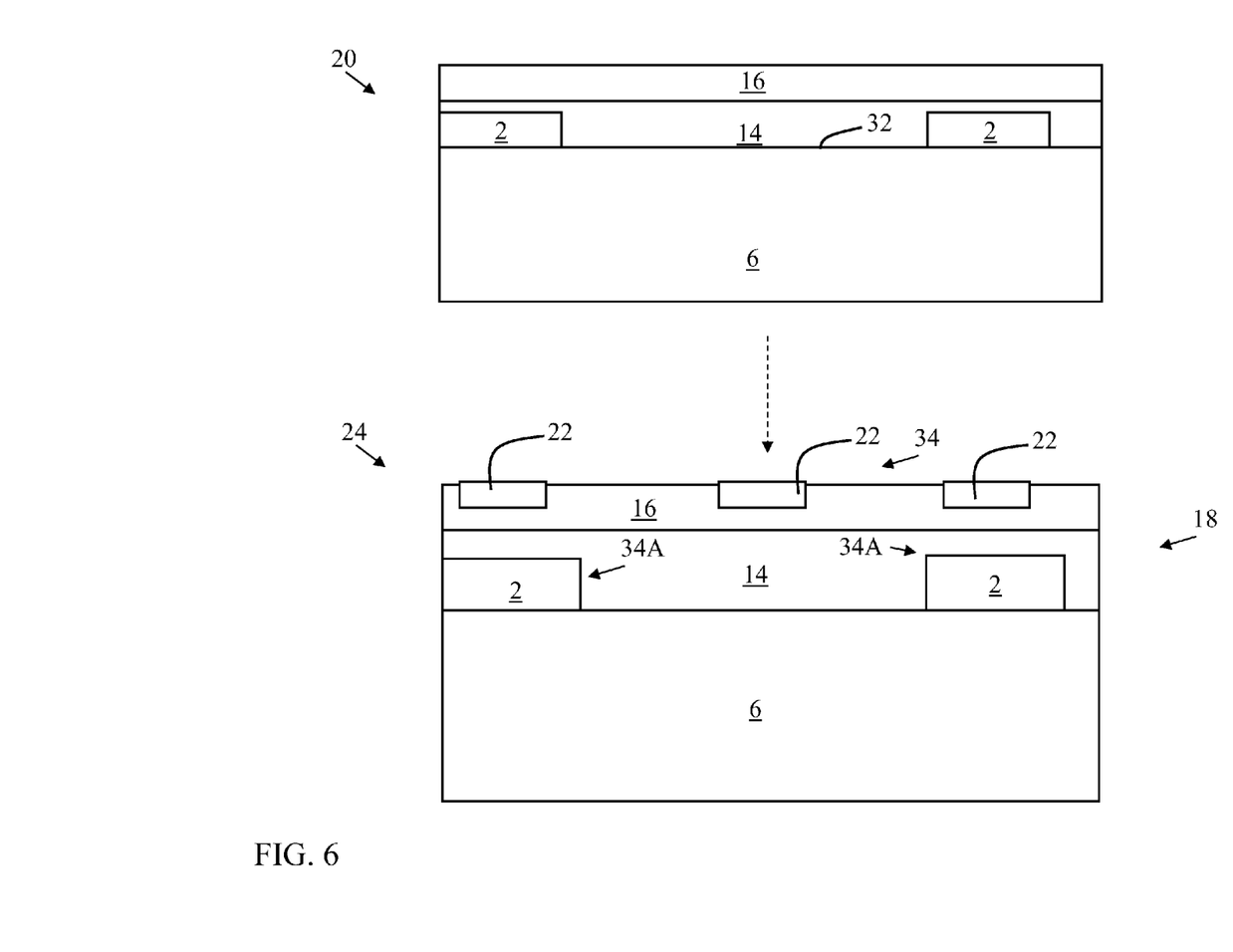
FIG. 6 shows a cross-sectional depiction of an integrated circuit device undergoing a process according to the flow diagram of FIG. 1.

Process P1: forming at least one thermoelectric cooling device 2 over an upper surface 4 of a handle wafer 6 based upon a known location 8 of an elevated temperature region in the IC device (device 24 shown in FIG. 6). In various embodiments, each thermoelectric cooling device 2 is formed to contact upper surface 4 of handle wafer 6. In various embodiments, each thermoelectric cooling device 2 is formed on the handle wafer 6. FIG. 3 shows close-up schematic depictions of thermoelectric cooling device 2 according to various embodiments. In various embodiments, forming the at least one thermoelectric cooling device 2 can include patterning and depositing a metal or silicide 10 in a pattern over handle wafer 6. The metal or silicide 10 can be deposited within a pattern in an insulator 12, e.g., silicon, silicon dioxide, etc. The thermoelectric cooling device 2, as noted herein, can include a "cold side" and a "hot side," which facilitate heat transfer between the two sides and act to cool adjacent components. The process of forming such a thermoelectric cooling device 2 is known in the art, and as such, additional detail about its formation is omitted.

Figure 4:
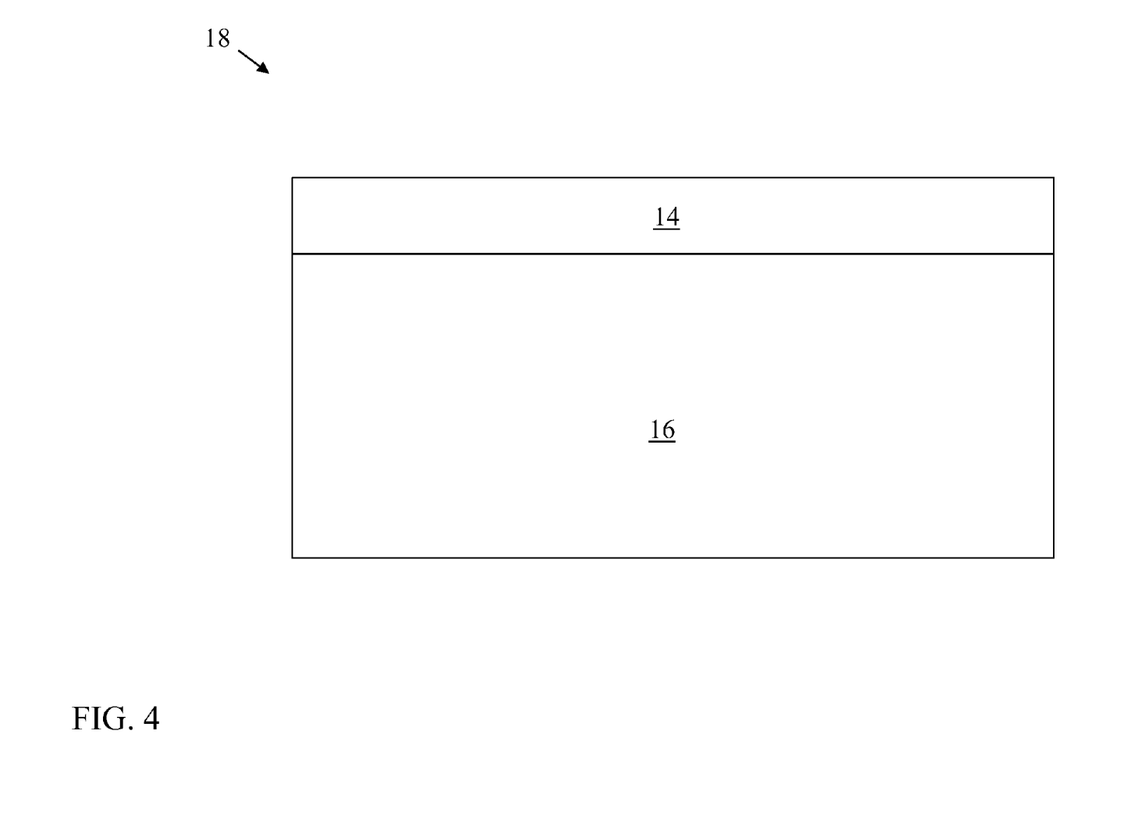
FIG. 4 shows a cross-sectional depiction of an integrated circuit device undergoing a process according to the flow diagram of FIG. 1.

Process P2: forming an oxide layer 14 over a donor silicon wafer 16 to form a donor wafer 18 (FIG. 4). As is well known in the art of silicon-on-insulator (SOI) device formation, donor wafer 18 can be formed by depositing (e.g., blanket depositing) oxide layer 14 over donor silicon wafer 16.

Figure 5:
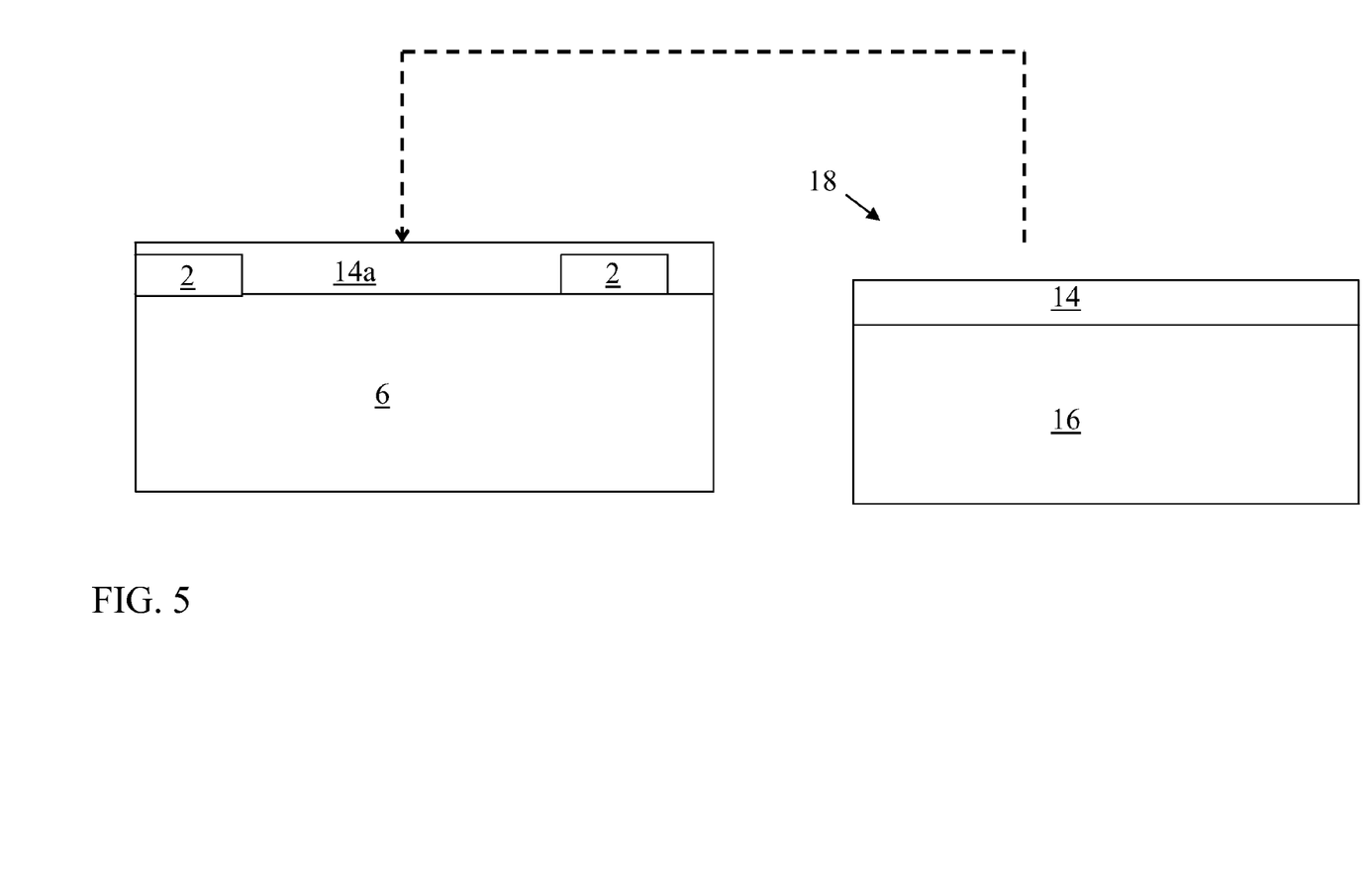
FIG. 5 shows a cross-sectional depiction of an integrated circuit device undergoing a process according to the flow diagram of FIG. 1.

Process P3: As shown in FIG. 5, and known in the art of SOI device formation, a second oxide 14a is formed over handle wafer 6 and thermoelectric cooling device 2 (e.g., via conventional deposition techniques), and donor wafer 18 can be bonded to handle wafer 6 at oxide layers 14 and 14a, e.g., via conventional annealing techniques. Oxide layer 14 contacts upper surface 4 of second oxide layer 14a, and overlies each thermoelectric cooling device 2. Oxide layers 14 and 14a are referred to collectively after bonding simply as oxide layer 14. According to various embodiments, as is known in the art, a portion of the donor silicon wafer 16 can be amorphized (e.g., ion implanted), and subsequently removed (e.g., cleaved through donor silicon wafer 16) to form an SOI substrate 20. However, this process is not necessary in all embodiments. In various embodiments, where the donor silicon wafer 16 is ion implanted (in order to amorphize), donor silicon wafer 16 can be implanted with an implant species such as: argon (Ar) ions, neon (Ne) ions, silicon (Si) ions, indium (In) ions, oxygen (O) ions, germanium (Ge) ions, arsenic (As) ions, phosphorous (P) ions, or boron (B) ions. Ion implant regions can be formed using conventional masking and implanting approaches, for example, masking regions of the underlying donor silicon wafer 16, and implanting the exposed region of donor silicon wafer 16 with ions, resulting in amorphized silicon in the ion implant regions.

Process P4: As shown in FIG. 6, forming at least one semiconductor device 22 over donor silicon wafer side (16) of donor wafer 18. In various embodiments, the at least one semiconductor device 22 is formed according to conventional approaches, e.g., deposited, epitaxially grown, masked, etched and/or polished over donor silicon wafer 16 side of donor wafer 18. Semiconductor device(s) 22 can include one or more transistors, connectors, resistors, etc. In any case, each thermoelectric cooling device(s) 2 is located proximate a semiconductor device 20, that is, within a vertically corresponding region in the IC device 24.

Figure 7:
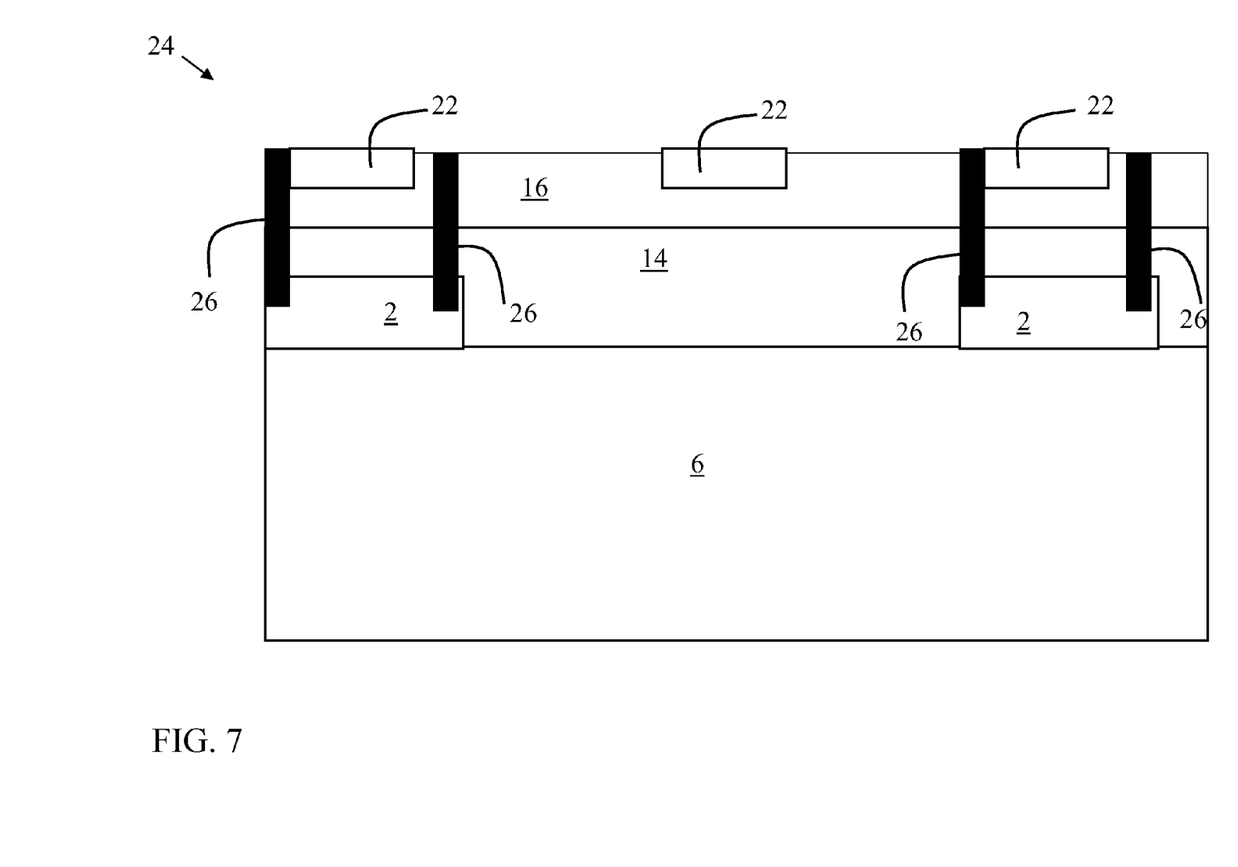
FIG. 7 shows a cross-sectional depiction of an integrated circuit device undergoing a process according to the flow diagram of FIG. 1.
Figure 8A:
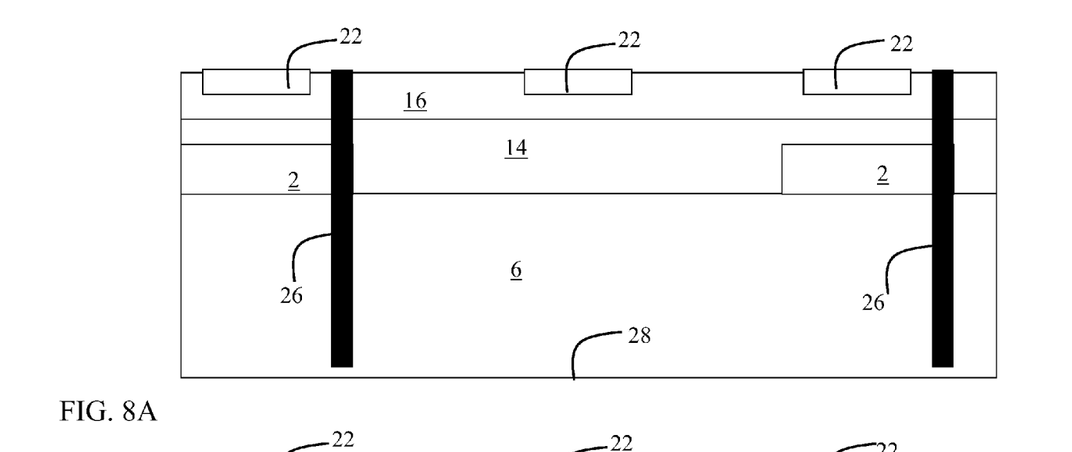
FIG. 8A shows a cross-sectional depiction of an integrated circuit device undergoing a process according to the flow diagram of FIG. 1.
Figure 8B:
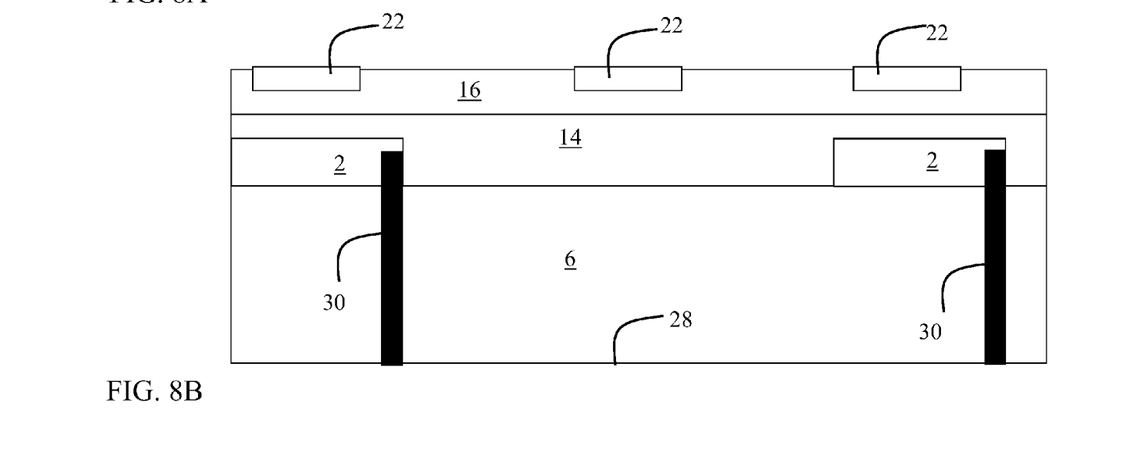
FIG. 8B shows a cross-sectional depiction of an integrated circuit device undergoing a process according to the flow diagram of FIG. 1.

Process P5 (shown as optional, in phantom): As shown in FIG. 7, forming a through-silicon-via (TSV) 26 proximate the at least one semiconductor device 22 and extending through the donor wafer 18 to contact the thermoelectric cooling device 2. In various embodiments, this can include applying a mask and etching through the donor wafer 18 at a location adjacent (e.g., next to or nearly contacting) semiconductor device 22, and filling the etched opening with a conductive material (e.g., a conventional contact metal such as copper, aluminum, etc.) to form TSV 26. In various embodiments, the opening formed prior to filling TSV 26 is etched to contact or land adjacent (e.g., next to or nearly contacting) thermoelectric cooling device 2. In some cases, TSV 26 is formed to contact an upper surface of thermoelectric cooling device 2, however, in other cases, TSV 26 is formed to contact a side of thermoelectric cooling device 2 (e.g., FIG. 8A). In various particular embodiments, the TSV 26 is formed to extend completely through handle wafer 6 to contact a lower surface 28 of handle wafer 6 (e.g., FIG. 8A). In additional alternative embodiments, at least one additional TSV 30 is formed from an underside of first silicon layer 6 (handle wafer) through first silicon layer 6 (handle wafer) to contact thermoelectric cooling device(s) 2 (e.g., FIG. 8B).

In various embodiments, the SOI device 20 (FIG. 6) is provided including the thermoelectric cooling device(s) 2 over upper surface 32 of first silicon layer (handle wafer 6), an oxide layer (oxide 14) over first silicon layer (handle wafer 6) and thermoelectric cooling device(s) 2, and a second silicon layer (16 over oxide layer 14). In these embodiments, processes P4 and P5 may be performed without forming the SOI device 20 as described in processes P1-P3.

Returning to FIG. 1, optional pre-process (process P0) is shown prior to process P1. Process P0 can include analyzing a data file 40 (FIG. 13) representing the IC device 24 (FIG. 6) during operation to determine the location of one or more elevated temperature regions 34A.

In various embodiments, Process P0 can include sub-processes such as:

P0A: running a functional simulation on data file 40 (FIG. 9) used to form IC device 24 (FIG. 6), where the functional simulation indicates a temperature of each of a plurality of regions 34 in IC device 24; and P0B: identifying at least one elevated temperature region 34A in plurality of regions 34 as having a simulated temperature greater than a (corresponding) temperature design condition, if such a region exists.

FIGS. 9A-9B, 10A-10B and 11A-11B show schematic cross-sectional depictions of processes in forming an IC structure 922 (FIG. 11B) according to various additional embodiments.

Figure 9A:
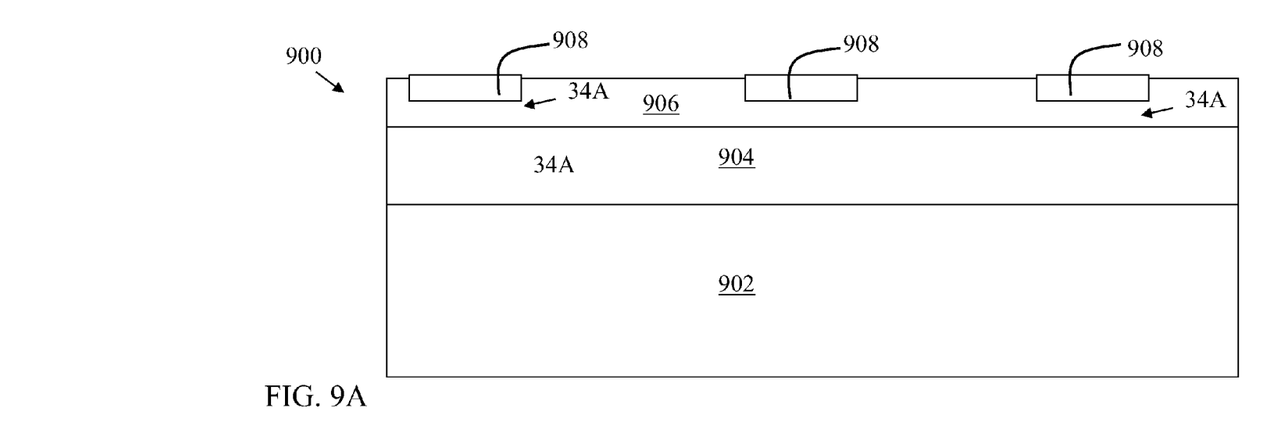
FIG. 9A shows a cross-sectional depiction of an integrated circuit device undergoing a process according to various embodiments of the disclosure.
Figure 9B:
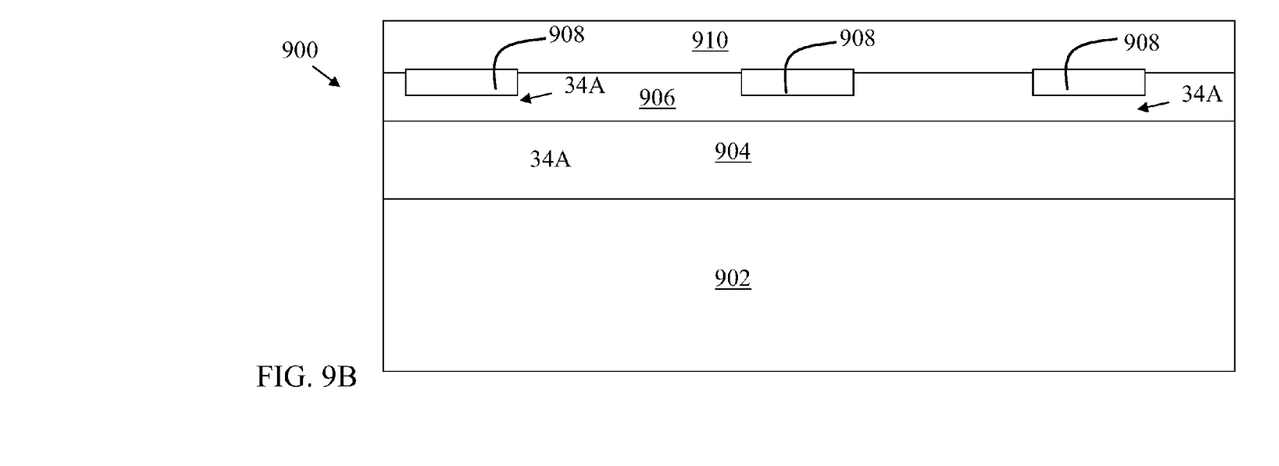
FIG. 9B shows a cross-sectional depiction of an integrated circuit device undergoing a process according to various embodiments of the disclosure.

As shown in FIG. 9A, a precursor structure 900 includes a substrate 902 (e.g., including silicon), an oxide layer 904 (e.g., including silicon dioxide or other suitable dioxide) over substrate 902, and a device layer 906 (e.g., including silicon) over the oxide layer 904. The device layer 906 can include one or more devices 908 (e.g., transistors, resistors, etc.), and may have one or more elevated temperature regions 34A, as described herein. FIG. 9B illustrates a process including depositing a second oxide layer 910 over device layer 906, e.g., via conventional deposition techniques.

Figure 10A:
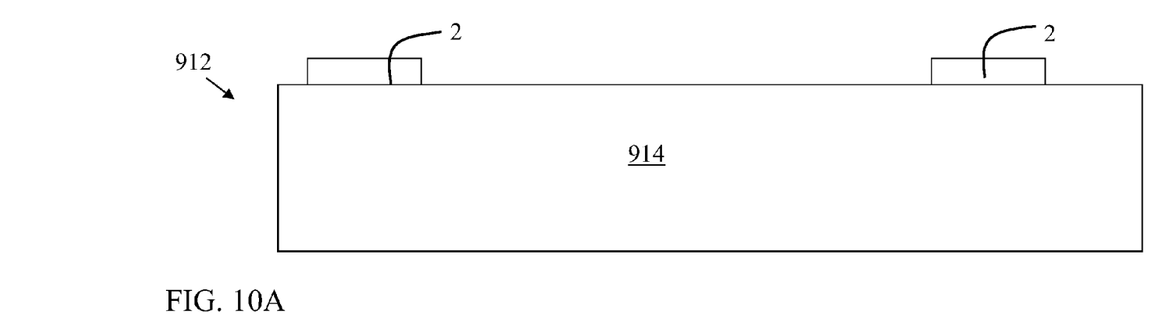
FIG. 10A shows a cross-sectional depiction of an integrated circuit device undergoing a process according to various embodiments of the disclosure.
Figure 10B:
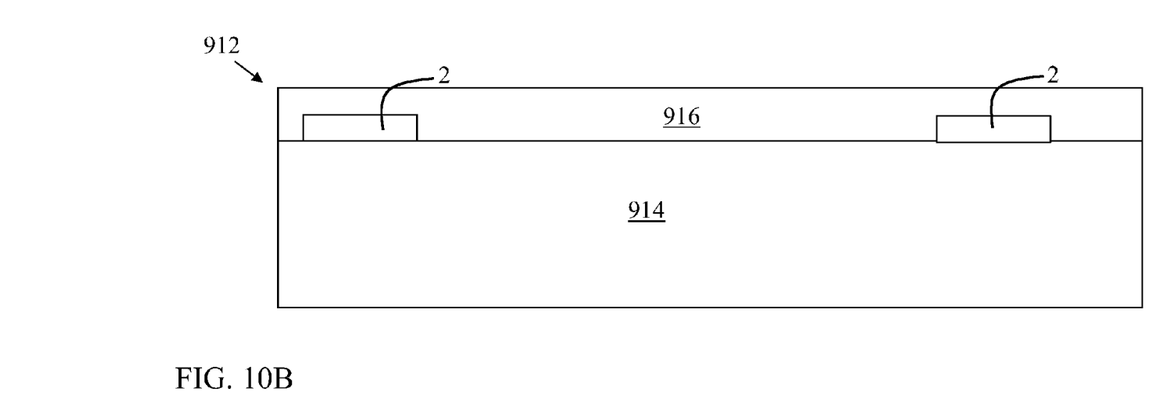
FIG. 10B shows a cross-sectional depiction of an integrated circuit device undergoing a process according to various embodiments of the disclosure.
Figure 11A:
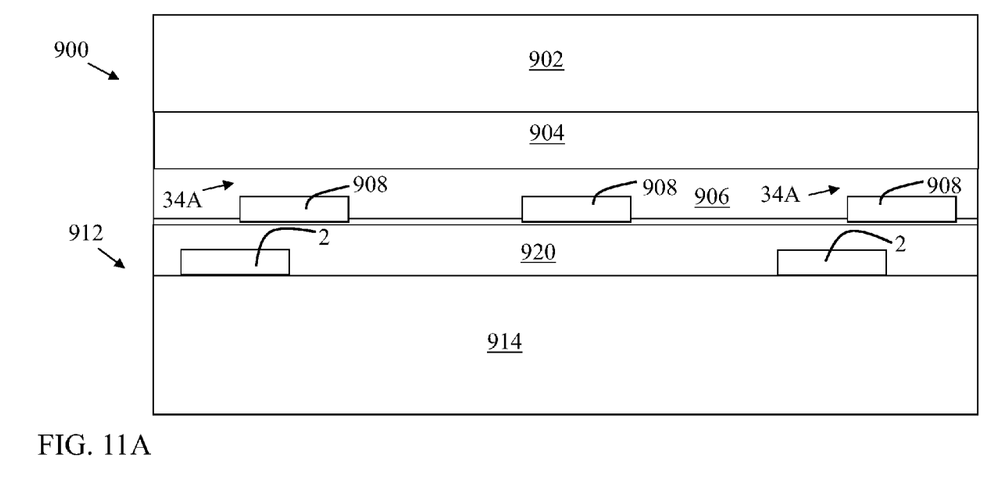
FIG. 11A shows a cross-sectional depiction of an integrated circuit device undergoing a process according to various embodiments of the disclosure.
Figure 11B:
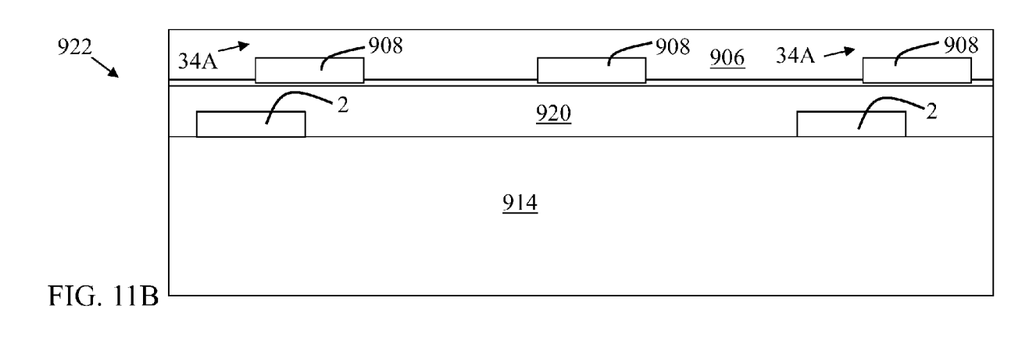
FIG. 11B shows a cross-sectional depiction of an integrated circuit device undergoing a process according to various embodiments of the disclosure.
Figure 12:
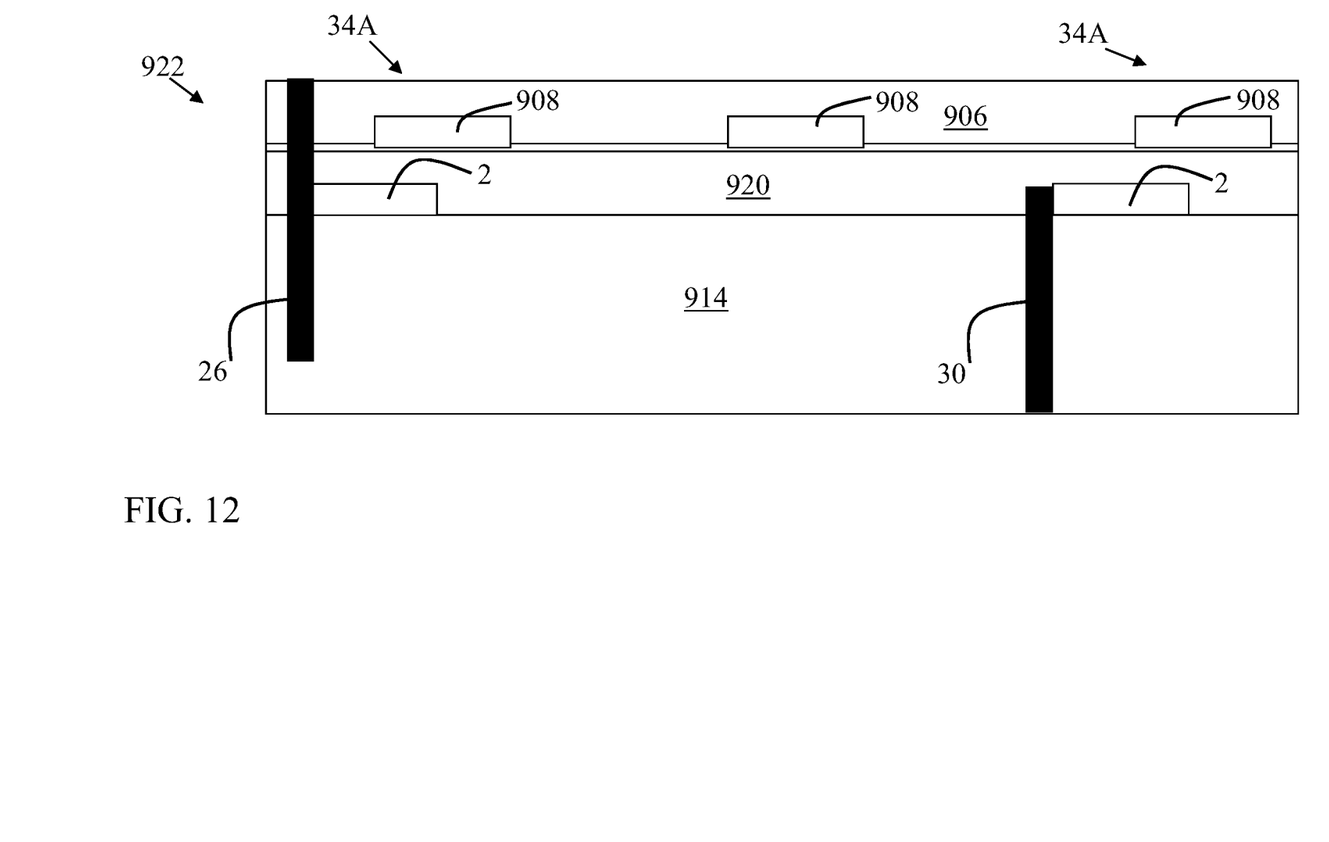
FIG. 12 shows a cross-sectional depiction of an integrated circuit device undergoing a process according to various embodiments of the disclosure.

In a separate process shown in FIGS. 10A-10B, either simultaneously or at a different time, a second precursor structure 912 is provided including at least one thermoelectric cooling device 2 over a substrate 914 (e.g., a silicon). The location of thermoelectric cooling device(s) 2 can be dictated, as described herein, by the corresponding location of elevated temperature region(s) 34A in precursor structure 900, which according to various embodiments described with reference to FIGS. 9A-11B, is joined with precursor structure 912 after intervening processes. In any case, a method can include depositing an oxide 916 (e.g., silicon dioxide or other suitable oxide) over the upper surface of substrate 914 to cover thermoelectric cooling devices 2 (FIG. 10B). Following depositing of oxide 916, inverted precursor structure 900 (FIG. 9B) is joined with precursor structure 912 (FIG. 10B) as shown in FIG. 11A. That is, second oxide layer 910 and oxide 916 are aligned to contact one another (precursor 900 over precursor 912), and the corresponding oxides (910, 916) are annealed to bond together forming a single oxide layer 920. Substrate 902 and oxide 904 can be subsequently cleaved (after annealing) according to conventional cleaving processes. Further, remaining oxide layer 904 can be removed via conventional polishing (e.g., chemical-mechanical polishing), acidic bath, or etching. After cleaving and removing remaining oxide 904, IC structure 922 is formed as shown in FIG. 11B. It is understood that subsequent wiring (e.g., metal) connections can be formed to contact devices 908 according to conventional approaches. Further additional back-end-of-line (BEOL) connections can be made to contact devices and/or thermoelectric cooling device(s) 2). For example, as shown in FIG. 12, an additional process can include forming one or more of TSVs 26 (from upper surface) and/or TSVs 30 (from lower surface) to contact thermoelectric cooling devices 2.

Figure 13:
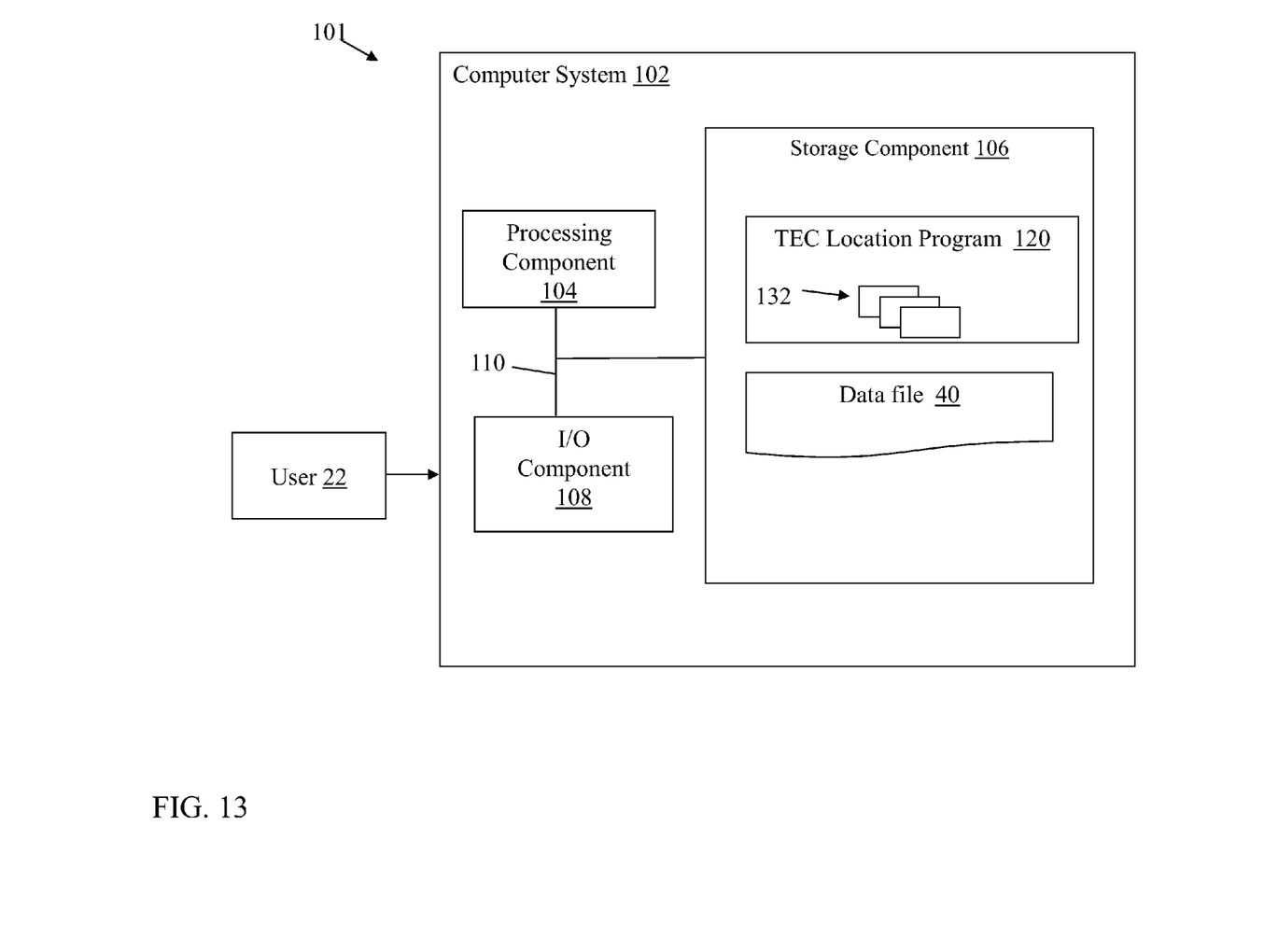
FIG. 13 shows an illustrative environment for performing processes according to various embodiments of the disclosure.

Turning more specifically to FIG. 13, an environment 101 including a computer system 102 that can perform processes described herein in order analyze a data file 40 representing an integrated circuit (IC) device 24 to determine a location of at least one thermoelectric cooling device 2. In particular, the computer system 102 is shown as including a thermoelectric cooling device location program (TEC location program) 120 TEC location program 120, which makes computer system 102 operable to analyze an IC layout (data file 40) to determine a location of at least one thermoelectric cooling device 2 by performing any/all of the processes described herein and implementing any/all of the embodiments described herein.

The computer system 102 is shown including a processing component 104 (e.g., one or more processors), a storage component 106 (e.g., a storage hierarchy), an input/output (I/O) component 108 (e.g., one or more I/O interfaces and/or devices), and a communications pathway 110. In general, the processing component 104 executes program code, such as the TEC location program 120, which is at least partially fixed in the storage component 106. While executing program code, the processing component 104 can process data, which can result in reading and/or writing transformed data from/to the storage component 106 and/or the I/O component 108 for further processing. The pathway 110 provides a communications link between each of the components in the computer system 102. The I/O component 108 can comprise one or more human I/O devices, which enable a user (e.g., a human or other user) 22 to interact with the computer system 102 and/or one or more communications devices to enable a system user 22 to communicate with the computer system 102 using any type of communications link. To this extent, the TEC location program 120 can manage a set of interfaces (e.g., graphical user interface(s), application program interface, etc.) that enable human and/or system users 22 to interact with the TEC location program 120. Further, the TEC location program 120 can manage (e.g., store, retrieve, create, manipulate, organize, present, etc.) data, such as data file 40 (e.g., including IC layout data, mask data and/or overlay threshold data, using any solution).

In any event, the computer system 102 can comprise one or more general purpose computing articles of manufacture (e.g., computing devices) capable of executing program code, such as the TEC location program 120, installed thereon. As used herein, it is understood that "program code" means any collection of instructions or algorithms, in any language, code or notation, that cause a computing device having an information processing capability to perform a particular function either directly or after any combination of the following: (a) conversion to another language, code or notation; (b) reproduction in a different material form; and/or (c) decompression. To this extent, the TEC location program 120 can be embodied as any combination of system software and/or application software.

Further, the TEC location program 120 can be implemented using a set of modules 132. In this case, a module 132 can enable the computer system 102 to perform a set of tasks used by the TEC location program 120, and can be separately developed and/or implemented apart from other portions of the TEC location program 120. As used herein, the term "component" means any configuration of hardware, with or without software, which implements the functionality described in conjunction therewith using any solution, while the term "module" means program code that enables the computer system 102 to implement the functionality described in conjunction therewith using any solution. When fixed in a storage component 106 of a computer system 102 that includes a processing component 104, a module is a substantial portion of a component that implements the functionality. Regardless, it is understood that two or more components, modules, and/or systems may share some/all of their respective hardware and/or software. Further, it is understood that some of the functionality discussed herein may not be implemented or additional functionality may be included as part of the computer system 102.

When the computer system 102 comprises multiple computing devices, each computing device may have only a portion of TEC location program 120 fixed thereon (e.g., one or more modules 132). However, it is understood that the computer system 102 and TEC location program 120 are only representative of various possible equivalent computer systems that may perform a process described herein. To this extent, in other embodiments, the functionality provided by the computer system 102 and TEC location program 120 can be at least partially implemented by one or more computing devices that include any combination of general and/or specific purpose hardware with or without program code. In each embodiment, the hardware and program code, if included, can be created using standard engineering and programming techniques, respectively.

Regardless, when the computer system 102 includes multiple computing devices, the computing devices can communicate over any type of communications link. Further, while performing a process described herein, the computer system 102 can communicate with one or more other computer systems using any type of communications link. In either case, the communications link can comprise any combination of various types of wired and/or wireless links; comprise any combination of one or more types of networks; and/or utilize any combination of various types of transmission techniques and protocols.

The computer system 102 can obtain or provide data, such as data file 40 using any solution. For example, the computer system 102 can generate and/or be used to retrieve data file 40 from one or more data stores, receive data file 40 from another system, send data file 40 to another system, etc.

While shown and described herein as methods, systems, and computer program products for analyzing an IC layout to determine a location of a thermoelectric cooling device in the IC, it is understood that aspects of the invention further provide various alternative embodiments. For example, in one embodiment, the invention provides a computer program fixed in at least one computer-readable medium, which when executed, enables a computer system to analyze an IC layout to determine a location of a thermoelectric cooling device in the IC. To this extent, the computer-readable medium includes program code, such as the TEC location program 120 (FIG. 13), which implements some or all of the processes and/or embodiments described herein. It is understood that the term "computer-readable medium" comprises one or more of any type of tangible medium of expression, now known or later developed, from which a copy of the program code can be perceived, reproduced, or otherwise communicated by a computing device. For example, the computer-readable medium can comprise: one or more portable storage articles of manufacture; one or more memory/storage components of a computing device; paper; etc.

In another embodiment, the invention provides a method of providing a copy of program code, such as the TEC location program 120 (FIG. 13), which implements some or all of a process described herein. In this case, a computer system can process a copy of program code that implements some or all of a process described herein to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a system for analyzing an IC layout to determine a location of a thermoelectric cooling device in the IC. In this case, a computer system, such as the computer system 102 (FIG. 13), can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; etc.

It is understood that aspects of the invention can be implemented as part of a business method that performs a process described herein on a subscription, advertising, and/or fee basis. In this case, the service provider can manage (e.g., create, maintain, support, etc.) a computer system, such as computer system 102 (FIG. 7), that performs a process described herein for one or more customers. In return, the service provider can receive payment from the customer(s) under a subscription and/or fee agreement, receive payment from the sale of advertising to one or more third parties, and/or the like.

The terminology used herein is for the purpose of describing particular example embodiments only and is not intended to be limiting. As used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

We claim:

1. A method of forming an integrated circuit (IC) device, the method comprising:

forming at least one thermoelectric cooling device over an upper surface of a handle wafer based upon a known location of an elevated temperature region in the IC device;

forming a first oxide layer over the handle wafer covering the thermoelectric cooling device;

forming a second oxide layer over a donor silicon wafer to form a donor wafer;

bonding the donor wafer to the handle wafer at the first oxide layer and the second oxide layer, such that the second oxide layer contacts the first oxide layer on the handle wafer; and forming at least one semiconductor device over a side of the donor wafer opposite the second oxide layer, wherein the at least one thermoelectric cooling device is located proximate the at least one semiconductor device.

2. The method of claim 1, further comprising: analyzing a data file representing the IC device during operation to determine the location of the elevated temperature region, using a computing device including a processor.

3. The method of claim 2, wherein the location of the elevated temperature region is determined by comparing a temperature of a plurality of regions in the IC with temperature design conditions for each of the plurality of regions to determine whether at least one of the plurality of regions exceeds a corresponding temperature design condition.

4. The method of claim 1, wherein the at least one thermoelectric cooling device is formed to contact the upper surface of the handle wafer during the forming.

5. The method of claim 1, further comprising cleaving the donor wafer through the donor silicon wafer to form a silicon-on-insulator substrate prior to the forming of the at least one semiconductor device.

6. The method of claim 5, further comprising forming a through-silicon-via (TSV) proximate the at least one semiconductor device and extending through the donor wafer to contact the thermoelectric cooling device.

7. The method of claim 6, wherein the forming of the TSV include forming the TSV to further extend through the handle waver to contact a lower surface of the handle wafer.

8. The method of claim 7, wherein the TSV contacts the thermoelectric cooling device on a side of the thermoelectric cooling device.

9. A method of forming an integrated circuit (IC) device, the method comprising: forming at least one semiconductor device over a silicon-on-insulator (SOI) substrate, the SOI substrate having: a first silicon layer; at least one thermoelectric cooling device over an upper surface of the first silicon layer; an oxide layer over the first silicon layer and the at least one thermoelectric cooling device; and a second silicon layer over the oxide layer wherein the at least one semiconductor device is formed over the second silicon layer; and forming at least one through silicon via (TSV) from a region proximate the at least one semiconductor device in the second silicon layer, through the oxide layer, to contact the at least one thermoelectric cooling device, wherein the at least one semiconductor device is located in an elevated temperature region of the IC device, and wherein a location of the at least one thermoelectric cooling device is determined to vertically correspond with the elevated temperature region.

10. The method of claim 9, further comprising: analyzing a data file representing the IC device during operation to determine the location of the elevated temperature region, using a computing device including a processor.

11. The method of claim 10, wherein the location of the elevated temperature region is determined by comparing a temperature of a plurality of regions in the IC with temperature design conditions for each of the plurality of regions to determine whether at least one of the plurality of regions exceeds a corresponding temperature design condition.

12. The method of claim 9, wherein the at least one thermoelectric cooling device contacts the upper surface of the handle wafer.

13. The method of claim 9, wherein the forming of the at least one TSV includes forming a plurality of TSVs from regions proximate the at least one semiconductor device in the second silicon layer, through the oxide layer, to contact the at least one thermoelectric cooling device.

14. The method of claim 9, further comprising forming at least one additional TSV from an underside of the first silicon layer, through the first silicon layer, to contact the at least one thermoelectric cooling device.

15. The method of claim 9, wherein the forming of the at least one TSV includes forming the at least one TSV to extend alongside the at least one thermoelectric cooling device and through the first silicon layer to contact an underside of the first silicon layer.

16. A method of forming an integrated circuit (IC) device, the method comprising: running a functional simulation on a data file used to form the IC device, the functional simulation indicating a temperature of each of a plurality of regions in the IC device; identifying at least one elevated temperature region in the plurality of regions as having a simulated temperature greater than a temperature design condition; forming at least one thermoelectric cooling device over an upper surface of a handle wafer based upon the location of the elevated temperature region in the IC device; forming a first oxide layer over the handle wafer covering the thermoelectric cooling device; forming a second oxide layer over a donor silicon wafer to form a donor wafer; bonding the donor wafer to the handle wafer at the first oxide layer and the second oxide layer, such that the second oxide layer contacts the first oxide on the handle wafer; and forming at least one semiconductor device over a side of the donor wafer opposite the second oxide layer, wherein the at least one thermoelectric cooling device is located proximate the at least one semiconductor device.

17. The method of claim 16, wherein the at least one thermoelectric cooling device is formed to contact the upper surface of the handle wafer during the forming.

18. The method of claim 16, further comprising cleaving the donor wafer through the donor silicon wafer to form a silicon-on-insulator substrate prior to the forming of the at least one semiconductor device.

19. The method of claim 18, further comprising forming a through-silicon-via (TSV) proximate the at least one semiconductor device and extending through the donor wafer to contact the thermoelectric cooling device.

20. The method of claim 19, wherein the forming of the TSV include forming the TSV to further extend through the handle waver to contact a lower surface of the handle wafer, wherein the TSV contacts the thermoelectric cooling device on a side of the thermoelectric cooling device.

* * * * *